United States Patent
Yu et al.

(10) Patent No.: US 8,436,254 B2
(45) Date of Patent: May 7, 2013

(54) METHOD OF FABRICATING CIRCUIT BOARD STRUCTURE

(75) Inventors: Cheng-Po Yu, Taoyuan County (TW); Han-Pei Huang, Taoyuan (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 0 days.

(21) Appl. No.: 13/301,812

(22) Filed: Nov. 22, 2011

(65) Prior Publication Data

US 2012/0060368 A1 Mar. 15, 2012

Related U.S. Application Data

(62) Division of application No. 12/260,096, filed on Oct. 29, 2008.

(30) Foreign Application Priority Data

Jul. 14, 2008 (TW) ................................. 97126624 A

(51) Int. Cl.
*H05K 1/00* (2006.01)
(52) U.S. Cl.
USPC ........... 174/258; 174/256; 174/262; 174/266; 361/679.06; 361/713; 361/737; 361/818; 257/676; 257/734; 438/49; 438/126; 29/830; 29/831; 29/846; 428/195.1; 428/209
(58) Field of Classification Search ............... 174/258, 174/256, 262, 266; 361/713, 737, 818, 679.06; 257/676, 734; 438/49, 126; 29/830, 831, 29/846; 428/195.1, 209

See application file for complete search history.

(56) References Cited

U.S. PATENT DOCUMENTS

| | | |
|---|---|---|
| 4,071,367 A | 1/1978 | Collier |
| 4,924,152 A | 5/1990 | Flickinger |
| 4,985,293 A | 1/1991 | Keep |
| 5,294,897 A | 3/1994 | Notani |
| 5,403,978 A | 4/1995 | Drabek |
| 5,519,585 A | 5/1996 | Jones |
| 5,572,408 A | 11/1996 | Anhalt |
| 5,594,234 A | 1/1997 | Carter |
| 5,665,653 A * | 9/1997 | Bare et al. ................. 438/49 |
| 6,203,328 B1 | 3/2001 | Ortega |
| 6,315,205 B1 | 11/2001 | Bates |
| 6,365,979 B1 | 4/2002 | Miyajima |
| 6,706,326 B1 | 3/2004 | Hartogs |
| 7,987,589 B2 * | 8/2011 | Huang et al. ............... 29/846 |
| 2002/0050148 A1* | 5/2002 | Shyy et al. ................ 62/498 |
| 2004/0032371 A1* | 2/2004 | Mendolia et al. ......... 343/702 |

(Continued)

FOREIGN PATENT DOCUMENTS

| | | |
|---|---|---|
| CN | 1731915 A | 2/2006 |
| EP | 1209959 | 5/2002 |

(Continued)

*Primary Examiner* — Xiaoliang Chen
(74) *Attorney, Agent, or Firm* — Winston Hsu; Scott Margo

(57) ABSTRACT

A method of fabrication a circuit board structure comprising providing a circuit board main body, forming a molded, irregular plastic body having a non-plate type, stereo structure and at least one scraggy surface by encapsulating at least a portion of said circuit board main body with injection molded material, and forming a first three-dimensional circuit pattern on said molded, irregular plastic body thereby defining a three-dimensional circuit device.

15 Claims, 4 Drawing Sheets

U.S. PATENT DOCUMENTS

| | | | |
|---|---|---|---|
| 2004/0217472 A1* | 11/2004 | Aisenbrey et al. | 257/734 |
| 2005/0025960 A1 | 2/2005 | Levey | |
| 2005/0101161 A1 | 5/2005 | Weiblen | |
| 2005/0214597 A1* | 9/2005 | Kim et al. | 429/7 |
| 2005/0224253 A1* | 10/2005 | Aoki et al. | 174/256 |
| 2005/0260791 A1 | 11/2005 | Beatson | |
| 2006/0091522 A1 | 5/2006 | Bachmaier | |
| 2006/0231290 A1* | 10/2006 | Kariya et al. | 174/258 |
| 2007/0001802 A1 | 1/2007 | Hsieh | |
| 2007/0026567 A1 | 2/2007 | Beer | |
| 2007/0117276 A1 | 5/2007 | Chen | |
| 2007/0247822 A1 | 10/2007 | Naundorf | |
| 2008/0158825 A1* | 7/2008 | Hakunti et al. | 361/713 |
| 2008/0303125 A1 | 12/2008 | Chen | |
| 2008/0315385 A1 | 12/2008 | Gerber | |
| 2008/0315399 A1 | 12/2008 | Bauer | |
| 2009/0256222 A1 | 10/2009 | Hsu | |
| 2010/0006327 A1* | 1/2010 | Yu et al. | 174/258 |
| 2010/0077610 A1* | 4/2010 | Tseng et al. | 29/846 |
| 2010/0089627 A1* | 4/2010 | Huang et al. | 174/258 |

FOREIGN PATENT DOCUMENTS

| | | |
|---|---|---|
| TW | 558807 | 10/2003 |
| TW | I264736 | 10/2006 |
| TW | 200641021 | 12/2006 |
| TW | 200704336 | 1/2007 |
| TW | 200738085 | 10/2007 |

* cited by examiner

METHOD OF FABRICATING CIRCUIT BOARD STRUCTURE

CROSS REFERENCE TO RELATED APPLICATIONS

This application is a division of U.S. patent application Ser. No. 12/260,096, filed Oct. 29, 2008, which is hereby incorporated by reference for all purposes.

BACKGROUND OF THE INVENTION

1. Field of the Invention

The present invention relates to a method of fabricating a circuit board structure. In particular, the present invention relates to a method of fabricating a circuit board having a three-dimensional circuit structure.

2. Description of the Prior Art

As known in the art, circuit boards are essential devices in all electronic products where circuit boards are used to bear all kinds of electronic elements such as chips, resistors or capacitors. There are many layers of wires to connect these electronic elements.

As the electronic products become smaller and thinner, in many application fields such as wireless communication, portable electronic device or automobile instrumental panel, the circuit boards are always placed in limited space in the product, or interconnected with another outer circuit boards by buses or module-connectors, such as in the automobile instrumental panels or steering wheel with electronic functions. Thus, efficiently using substrate or the surface of module shell to pattern three-dimensional circuit layout or reducing the use of buses may be more efficient to utilize the space and increase the flexibility of designing. However, on plate-type plastic or copper foil substrate, conventional circuit manufacturing technology can only form two-dimensional wire trace instead of three-dimensional pattern.

SUMMARY OF THE INVENTION

It is one objective of the invention to provide a method for fabricating a circuit board structure. First, a circuit board main body is provided. Second, a molded plastic body is formed by encapsulating at least a portion of the circuit board main body with injection molded material. Then, a first three-dimensional pattern is formed on the molded plastic body thereby defining a three-dimensional circuit device.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel circuit board structure, comprising a circuit board main body that could be rigid printed circuit board (rigid PCB), flexible printed circuit board (flexible PCB), rigid-flex composite printed circuit board (rigid-flex composite PCB) or rigid-flex combination printed circuit board (rigid-flex combination PCB). At least a portion of the circuit board main body is encapsulated by an injection molded three-dimensional circuit device. For one of the ordinary skill in the art, it is challenging and difficult to manufacture this novel circuit board which is even applicable to a wide range of technical fields such as automobile steering wheels, cellular phones or semiconductor package.

Figure 1:
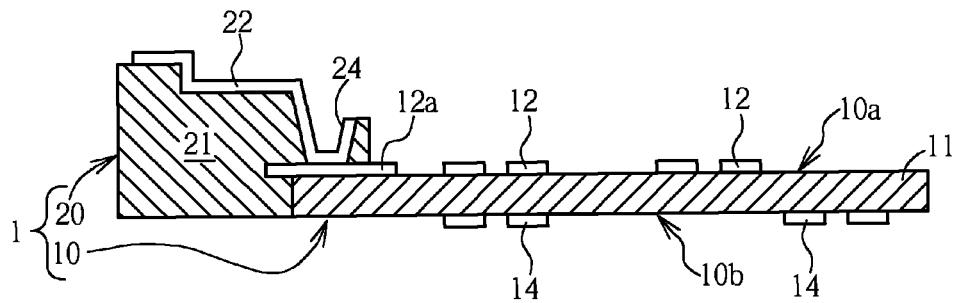
FIG. 1 illustrates a cross-sectional view of a circuit board structure according to an embodiment of the present invention.

FIG. 1 illustrates a cross-sectional view of a circuit board structure 1 according to an embodiment of the present invention. As shown in FIG. 1, the circuit board structure 1 comprises a circuit board main body 10, which may be a typical plate-type printed circuit board, such as a rigid printed circuit board (rigid PCB), a flexible printed circuit board (flexible PCB), a rigid-flex composite printed circuit board (rigid-flex composite PCB) or a rigid-flex combination printed circuit board (rigid-flex combination PCB). The circuit board main body 10 comprises a core layer 11, for example, a Prepreg resin-containing material. A coplanar first pattern 12 is disposed on a first side 10a of the circuit board main body 10 and a coplanar second pattern 14 is disposed on a second side 10b of the circuit board main body 10. Furthermore, the circuit board main body 10 may be a two-layer board, a four-layer board or a multi-layer board, which, however, should not be seen as to limit the scope of the present invention. FIG. 1 shows an example of a two-layer board.

The present invention circuit board structure 1 features an injection molded three-dimensional circuit device 20. The three-dimensional circuit device 20 encapsulates at least a portion of the circuit board main body 10 such as a peripheral region and the three-dimensional circuit device 20 combines with the encapsulated portion of the circuit board main body 10 tightly. The three-dimensional circuit device 20 further comprises an injected molded plastic body 21 which is non-plate, stereo type and usually contains a scraggy surface, on which at least a three-dimensional pattern 22 is fabricated. The three-dimensional pattern 22 is interconnected with a contact pad 12a of the first pattern 12 through a conductive via 24 in the molded plastic body 21.

According to one embodiment of the present invention, the above-mentioned injected molded plastic body 21 is made of plastic material comprising engineering plastic or ceramic. Specifically, the engineering plastic may be selected from a group consisting of polycarbonate (PC), acrylonitrile-butadiene-styrene copolymer (ABS copolymer), polyethylene terephthalate (PET), polybutylene terephthalate (PBT), liquid crystalline polymer (LCP), polyamide 6 (PA 6), Nylon, polyoxymethylene (POM), poly-phenylone-sulfide (PPS) and cyclic-olefin-copolymer (COC).

In addition, the plastic material further comprises catalytic particles, such as copper oxide particles, aluminum nitride particles or palladium particles. The plastic material is mixed with catalytic particles to form a laser activable material. The catalytic particles described above may be a plurality of metal oxide particles or metallic complexes particles. In one embodiment of the present invention, the catalytic particles are selected from a group consisting of manganese, chromium, palladium, copper, aluminum and platinum.

Figure 2A:
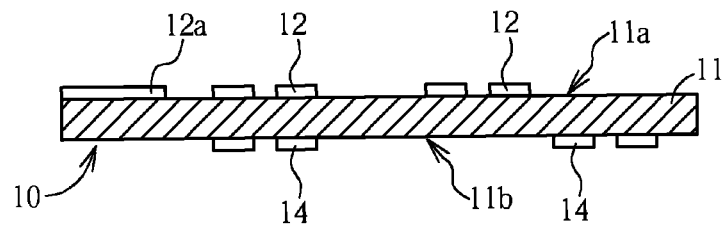
FIGS. 2A to 2C illustrate a method for fabricating the circuit board structure according to an embodiment of the present invention.
Figure 2B:
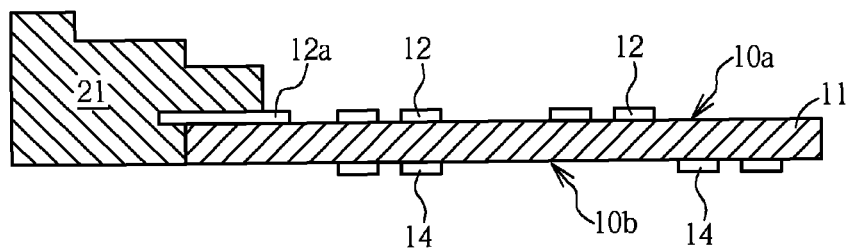
Figure 2C:
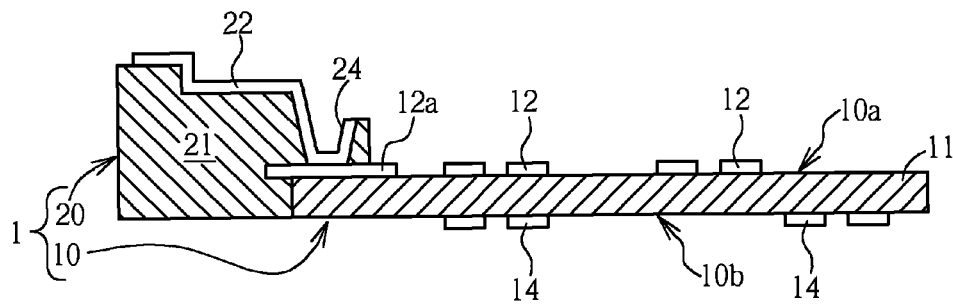

FIG. 2A to 2C illustrates the method for fabricating the circuit board structure 1 according to the embodiment of the present invention. First, as shown in FIG. 2A, a circuit board main body 10 is provided. The circuit board main body 10 may be a typical plate-type printed circuit board, such as a rigid PCB, a flexible PCB, a rigid-flex composite PCB or a rigid-flex combination PCB. The circuit board main body 10 comprises a core layer 11, such as a Prepreg resin-containing material. A coplanar first pattern 12 is formed on a first side 10a of the circuit board main body 10 and a coplanar second pattern 14 is formed on a second side 10b of the circuit board main body 10. It is understood that the circuit board main body 10 may be a two-layer board, a four-layer board or a multi-layer board, which, however, should not be seen as to limit the scope of the present invention. FIGS. 2A to 2C demonstrate an example of a two-layer board. Furthermore, a solder resist layer (not shown) may be provided on the first side 10a and the second side 10b of the circuit board main body 10.

As shown in FIG. 2B, at least a portion of the circuit board main body 10 is encapsulated with injection molded material, for example, by directly injected under low injected pressure or low molded temperature, thereby forming the molded plastic body 21 that encapsulates the circuit board main body 10. The molded plastic body 21 is non-plate, stereo type and usually contains a scraggy surface. In one embodiment of the present invention, the molded plastic body 21 encapsulates at least a portion of the contact pad 12a.

As shown in FIG. 2C, a three-dimensional pattern 22 is formed on the molded plastic body 21, thereby defining a three-dimensional circuit device 20. For example, laser direct structuring (LDS) is used to activate the metal catalysts in the molded plastic body 21, after laser activation, the metallization of chemical copper is performed. Certainly, other technology, for example, microscopic integrated processing technology (MIPTEC), may be used to form the three dimensional pattern 22 according to the present invention. MIPITEC comprises: depositing a conductive material by chemical vapor deposition (CVD) or sputtering, then patterning the conductive material by laser and etching away the conductive material in non-metallization region, next, metallizing by chemical copper. Additionally, a conventional two-shot molding technology may be used to form the three-dimensional pattern 22 by separately injecting two different plastic materials which are activatible and non-activatible respectively, then metallizing the activatible plastic material by wet procession. As described above, one approach to connecting the three-dimensional pattern 22 and the contact pad 12a involves mechanical or laser drilling and then filling with the conductive body (not shown), or directly penetrating the molded plastic body 21 by a metal conductive pillar to form a contact via. The conductive body described above may be formed by electroplating, chemical deposition or metal conductive material printing and padding.

Figure 3A:
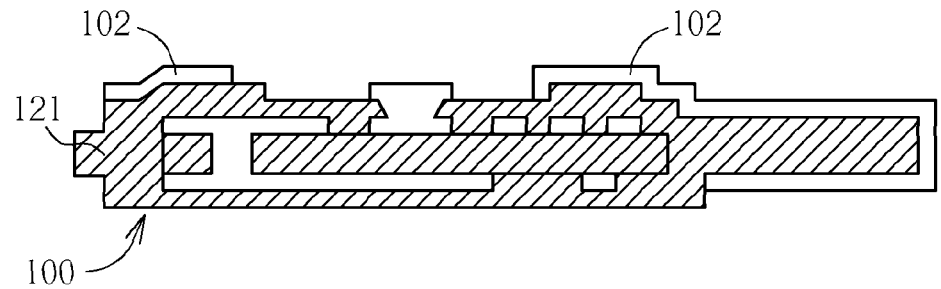
FIGS. 3A to 3C illustrate another embodiment according to the present invention.
Figure 3B:
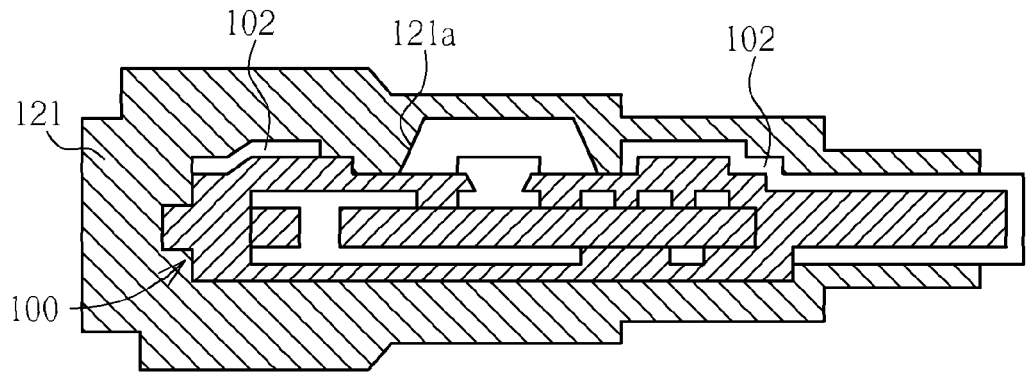
Figure 3C:
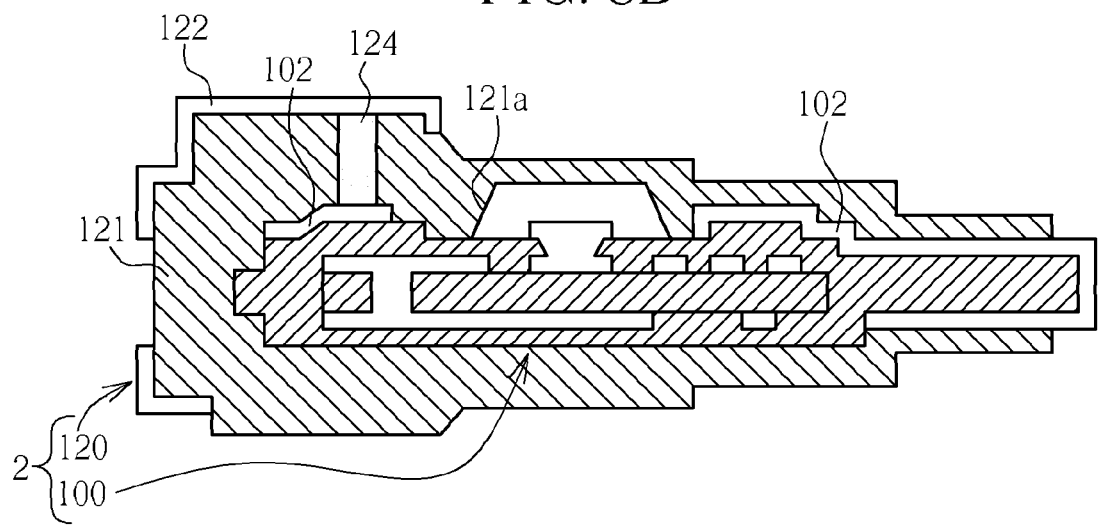

FIGS. 3A to 3C illustrate another embodiment according to the present invention. First, as shown in FIG. 3A, a circuit board main body 100 having thereon a three-dimensional pattern 102 is provided. The circuit board main body 100 may be a plate-type printed circuit board, such as a rigid PCB, a flexible PCB, a rigid-flex composite PCB or a rigid-flex combination PCB where is already formed.

As shown in FIG. 3B, a portion or all of the circuit board main body 100 is encapsulated with the molded plastic body 121. The injection molded material is used to encapsulate at least a portion or all of the circuit board main body 100, for example, by directly injected under low injected pressure or low molded temperature, thereby forming the molded plastic body 121 that encapsulates the circuit board main body 100. The molded plastic body 121 is non-plate, stereo type and has a scraggy surface. To prevent the molded plastic body 121 from contacting some sensitive elements and in consideration of the thermal expansion coefficient, the molded plastic body 121 may comprise a cavity 121a. The suitable materials for the molded plastic body 121 are similar to the molded plastic body 21 as described in the embodiment mentioned above.

As shown in FIG. 3C, a three-dimensional pattern 122 is formed on the molded plastic body 121, defining a three-dimensional circuit device 120. Thereafter, the three-dimensional pattern 122 is electrically connected with the three-dimensional pattern 102. For example, laser direct structuring (LDS) is used to activate the metal catalysts in the molded plastic body 121, after laser activation, the metallization of chemical copper is performed. Other technology, for example, microscopic integrated processing technology (MIPTEC), may be used to form three-dimensional pattern 122. Additionally, in the present invention, the two-shot molding technology may be used to form the three-dimensional pattern 122. As described above, one approach to connecting the three-dimensional pattern 122 and three-dimensional pattern 102 involves mechanical or laser drilling and then filling with the conductive body 124, or directly penetrating the molded plastic body 122 by a metal conductive pillar to form a contact via. The conductive body 124 described above may be formed by electroplating, chemical deposition or metal conductive material printing and padding.

Figure 4A:
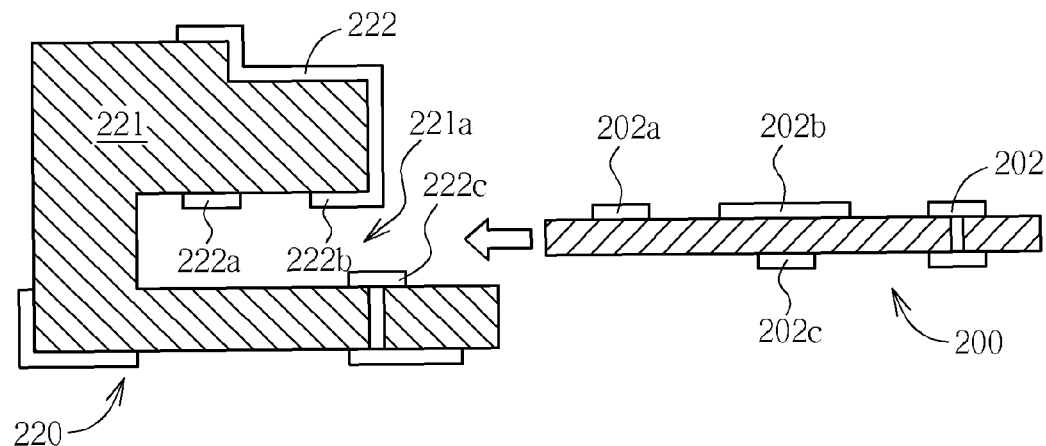
FIGS. 4A to 4B illustrate still another embodiment according to the present invention.
Figure 4B:
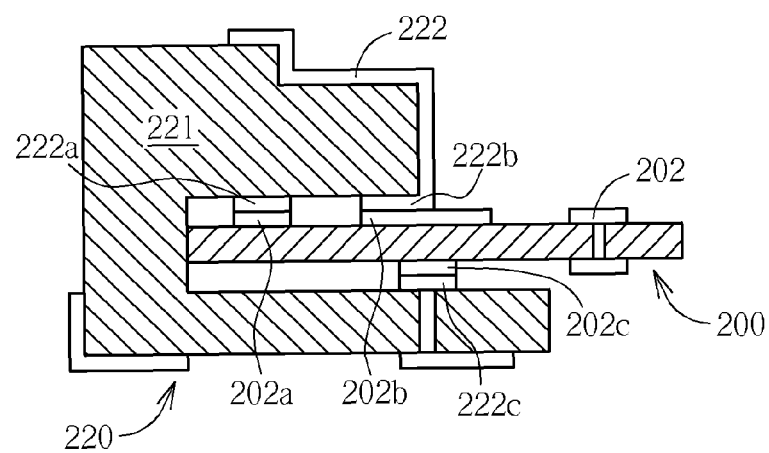

According to the present invention, the combination of the molded plastic and the circuit board main body is not necessary done by injection molded technology. FIGS. 4A and 4B illustrate another embodiment according to the present invention. First, as shown in FIG. 4A, a circuit board main body 200 and a three-dimensional circuit device 220 are formed separately. The circuit board main body 200 may be a typical plate-type printed circuit board, such as a rigid PCB, a flexible PCB, a rigid-flex composite PCB, a rigid-flex combination PCB or a circuit board with a three-dimensional pattern. The circuit board main body 200 has a pattern 202 which includes contact pads 202a, 202b and 202c. The three-dimensional circuit device 220 may be made by traditional injection molded technology and contains a molded plastic body 221 which is non-plate, stereo type and with a scraggy surface on which a three-dimensional pattern 222 is formed. The three-dimensional pattern 222 comprised contact pads 222a, 222b, and 222c.

The molded plastic body 221 further comprises a slot 221a. Subsequently, one end of the circuit board main body 200 is inserted into the slot 221a to make the contact pads 222a, 222b and 222c in contact with the contact pads 202a, 202b and 202c respectively, thereby tightly tenoning the molded plastic body and the circuit main board, as shown in FIG. 4B. While the material of the molded plastic body 221 is similar to the molded plastic body 21 in the embodiment mentioned above, it is not described herein for the sake of simplicity. The method for forming the three-dimensional patterns 222 on molded plastic body 221 is similar to the method for forming the three-dimensional patterns 122 on molded plastic body 121, which is mentioned above, thus it is not described for the sake of simplicity.

Figure 5A:
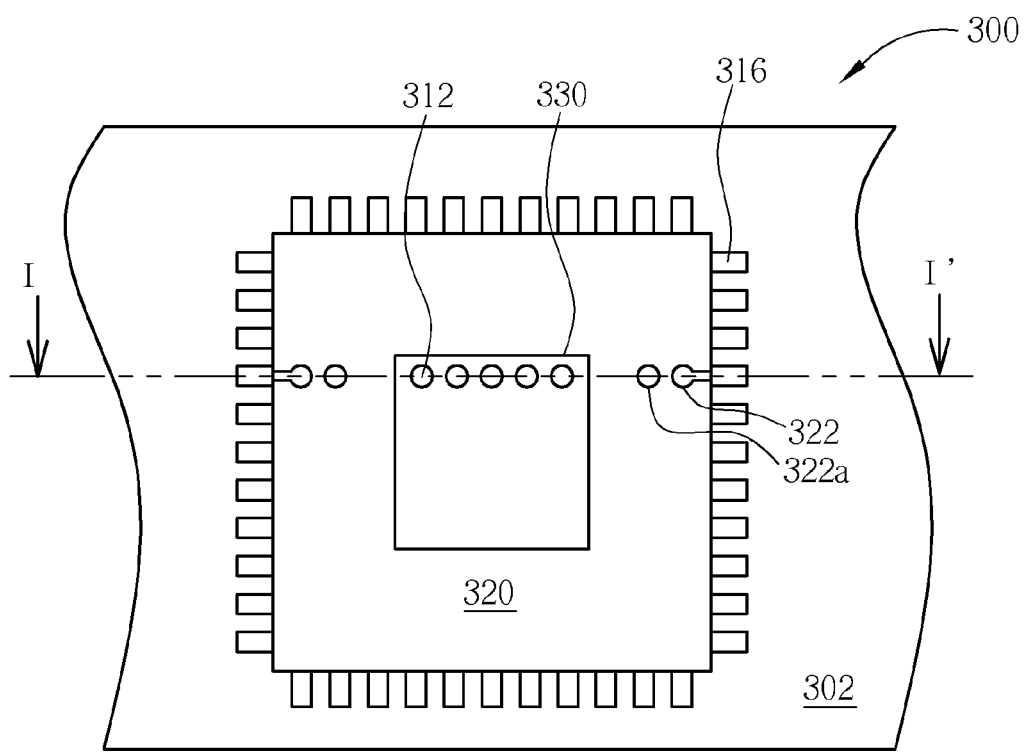
FIGS. 5A to 5B illustrate still another embodiment according to the present invention.
Figure 5B:
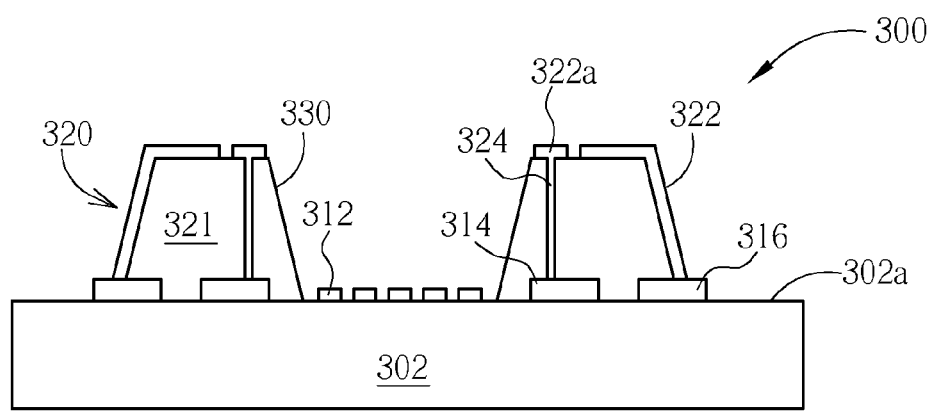

FIGS. 5A and 5B illustrate another embodiment according to the present invention. FIG. 5A illustrates a top view of the circuit board structure and FIG. 5B illustrates the cross-sectional view taken along line I-I' of FIG. 5A. As shown in FIGS. 5A and 5B, the circuit board structure 300 comprises a substrate 302 where at least plurality of contact pads 312, pattern 314 and pattern 316 are formed on its main surface 302a. Specifically, the pattern 316 may have four rows and may be arranged in matrix or, depending on different design purposes, may be arranged in single-row, 2-row or 3-row. Specifically, the disclosure of the figures is only one example embodiment that should not be used to limit the scope of the invention.

An injection molded three-dimensional circuit device 320 is formed on the main surface 302a, which contains a center cavity 330, exposing plurality of contact pads 312. The three-dimensional circuit device 320 comprises an injection molded body 321 having a non-plate type, stereo structure. At least a three-dimensional pattern 322 and another three-dimensional pattern 322a are formed on the surface of the molded main body 321 wherein the three-dimensional pattern 322 is connected to the pattern 316 encapsulated partially by the molded plastic body 321 while the three-dimensional pattern 322a is connected to the pattern 314 encapsulated by the molded plastic body 321 through a conductive via 324 in the molded plastic body 321. Besides, in another embodiment, the edge of the molded plastic body 321 aligns with the edge of the pattern 316, which is not shown in the figures.

The material of the molded plastic body 321 is similar to the molded plastic body 21 in the embodiment mentioned above, therefore it is not described herein for the sake of simplicity. The method for forming the three-dimensional patterns 322, 322a on the molded plastic body 321 is similar to the method for forming the three-dimensional patterns 122 on molded plastic body 121, which is mentioned above, thus it is not described for the sake of simplicity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a circuit board structure, comprising:
   providing a circuit board main body;
   forming a molded, irregular plastic body having a non-plate type, stereo structure and at least one scraggy surface by encapsulating at least a portion of said circuit board main body with injection molded material, wherein said injection molded material comprises catalytic particles;
   laser-activating said catalytic particles; and
   forming a first three-dimensional circuit pattern on said molded, irregular plastic body by metallization of activated said catalytic particles thereby defining a three-dimensional circuit device.

2. The method according to claim 1, wherein said molded, irregular plastic body is directly injected under low injected pressure or low molded temperature.

3. The method according to claim 1, wherein said circuit board main body includes rigid printed circuit board (rigid PCB), flexible printed circuit board (flexible PCB), rigid-flex composite printed circuit board (rigid-flex composite PCB) or rigid-flex combination printed circuit board (rigid-flex combination PCB).

4. The method according to claim 1, wherein said circuit board main body comprises a two-layer board or a multi-layer board.

5. The method according to claim 1, wherein said circuit board main body comprises a core layer.

6. The method according to claim 1, wherein said molded, irregular plastic body is made of plastic material comprising engineering plastic or ceramic.

7. The method according to claim 6, wherein said engineering plastic is selected from a group consisting of polycarbonate (PC), acrylonitrile-butadiene-styrene copolymer (ABS copolymer), polyethylene terephthalate (PET), polybutylene terephthalate (PBT), liquid crystalline polymer (LCP), polyamide 6 (PA 6), Nylon, polyoxymethylene (POM), poly-phenylone-sulfide (PPS) and cyclic-olefin-copolymer (COC).

8. The method according to claim 6, wherein said engineering plastic comprises said catalytic particles.

9. The method according to claim 8, wherein said catalytic particles comprise copper oxide particles, aluminum nitride particles or palladium particles.

10. The method according to claim 8, wherein said catalytic particles are selected from a group consisting of manganese, chromium, palladium, copper, aluminum and platinum.

11. The method according to claim 1, wherein the first side of said circuit board main body has a coplanar first pattern, the second side of said circuit board main body has a coplanar second pattern.

12. The method according to claim 11, wherein said first pattern is arranged in matrix and is partially covered by said molded plastic body.

13. The method according to claim 11, wherein an edge of said molded, irregular plastic body aligns with an edge of said first pattern.

14. The method according to claim 1, wherein said circuit board main body comprises a second three-dimensional circuit pattern.

15. The method according to claim 1, wherein said first three-dimensional pattern is formed by laser direct structuring (LDS), microscopic integrated processing technology (MIPTEC) or two-shot molding.

* * * * *